United States Patent [19]

Lane

[11] Patent Number: 4,459,566
[45] Date of Patent: Jul. 10, 1984

[54] VOLTAGE CONTROLLED OSCILLATOR USING A VOLTAGE TUNABLE FILTER WITH FEEDBACK

[75] Inventor: L. Jubin Lane, Salem, Va.

[73] Assignee: General Electric Company, Salem, Va.

[21] Appl. No.: 383,225

[22] Filed: May 28, 1982

[51] Int. Cl.³ .......................... H03B 5/20; H03C 3/00
[52] U.S. Cl. ................................ 331/135; 331/177 R; 332/23 R
[58] Field of Search .................... 331/135, 136, 177 R; 332/22, 23 R, 16 R

[56] References Cited

U.S. PATENT DOCUMENTS

| 3,800,241 | 3/1974 | Ochs | 331/135 X |
| 3,936,773 | 2/1976 | Wilkinson | 331/135 |
| 3,978,420 | 8/1976 | Lane | 330/107 |

FOREIGN PATENT DOCUMENTS

| 53-0033037 | 3/1978 | Japan | 331/135 |
| 1340971 | 12/1973 | United Kingdom | 331/135 |

OTHER PUBLICATIONS

*Operational Amplifier* McGraw Hill Book Co., pp. 400–403, 1971.

Primary Examiner—Siegfried H. Grimm
Attorney, Agent, or Firm—Arnold E. Renner

[57] ABSTRACT

A voltage controlled oscillator for producing an output signal having a frequency proportional to the magnitude of an input control signal includes a tunable filter circuit for simulating a resistance-inductance-capacitance (RLC) circuit with a resonant frequency approximately equal to the base or center frequency around which the voltage controlled oscillator is to operate. Through appropriate feedback means and multiple gain paths within the simulated RLC circuit, there is provided an output signal whose frequency is a function of the input control signal.

6 Claims, 3 Drawing Figures

VOLTAGE CONTROLLED OSCILLATOR USING A VOLTAGE TUNABLE FILTER WITH FEEDBACK

RELATED PATENT AND APPLICATION

This invention is related to U.S. Pat. No. 3,978,420 "Self-Tuning Filter" by L. Jubin Lane, issued Aug. 31, 1976, and to U.S. Patent application Ser. No. 383,076 "Frequency to Voltage Transducer" by L. Jubin Lane which was filed on even date herewith.

BACKGROUND OF THE INVENTION

The present invention relates generally to voltage controlled oscillators and more particularly to a narrow band voltage controlled oscillator which has a designed center frequency about which the output frequency can be varied in response to an input control signal.

There are, of course, a large number of different types of voltage controlled oscillators (VCO) which are known in the art and no attempt is here made to give a summary of these many types. In the general area of VCOs using operational amplifiers and multipliers, however, reference is made to the Burr-Brown text *Operational Amplifiers* published by McGraw-Hill Book Company (Copyright 1971—Library of Congress Catalog Card Number 74-163297). On page 402 of that publication there is shown a circuit which employs multipliers and operational amplifiers connected in an integration mode to provide a broad band VCO which produces both the direct and quadrature components of the oscillator output in response to a variable input signal. Although this teaching is, apparently, for normal broad band applications, (e.g., from zero to some finite output frequency) it is conceivable that an offset to some center frequency could be achieved by the inclusion of some form of biasing. Such biasing, which usually takes the form of a bias voltage, tends to have operational problems, however, since it is very difficult (or at least very expensive) to provide a bias power supply which does not drift.

In the aforementioned U.S. Pat. No. 3,978,420 there is described a self-tuning filter which has excellent stability characteristics and which is comprised, primarily, of multipliers and integrators with appropriate feedback paths. In the previously referenced application Ser. No. 383,076 there is described a frequency to voltage transducer which employs a modified version of the patent teaching.

SUMMARY OF THE INVENTION

It is, therefore, an object of the present invention to provide an improved voltage controlled oscillator.

It is a further object to provide a voltage controlled oscillator which is extremely stable and which has an output center frequency about which the output is varied in response to an input control signal.

It is a further object to provide a voltage controlled oscillator which may be selectably designed with respect to its center frequency.

Another object is to provide a new and improved voltage controlled oscillator employing a voltage tuned filter.

The foregoing and other objects are achieved in accordance with the present invention by providing a voltage controlled oscillator which provides an output signal having a frequency proportional to the magnitude of an input control signal. This oscillator employs a tunable filter circuit which simulates a resistance—inductance—capacitance (RLC) circuit, the resonant frequency of which is adjustable in response to the input control signal. The tunable filter circuit provides various signals representing the inductance, resistance and capacitance voltages of the simulated circuit through the employment of multiple gain paths, including integrating means, in association with feedback means responsive to the simulated resistance voltage. This combination produces the output signal(s) which has a frequency which is a function of the magnitude of the input control signal.

BRIEF DESCRIPTION OF THE DRAWING

Although the novel features of the present invention are set forth in particularity in the claims annexed to and forming a part of this specification, the invention, both as to organization and content, will be better understood and appreciated along with other objects and features thereof from the following detailed description taken in conjunction with the accompanying drawings in which:

DETAILED DESCRIPTION

Figure 1:
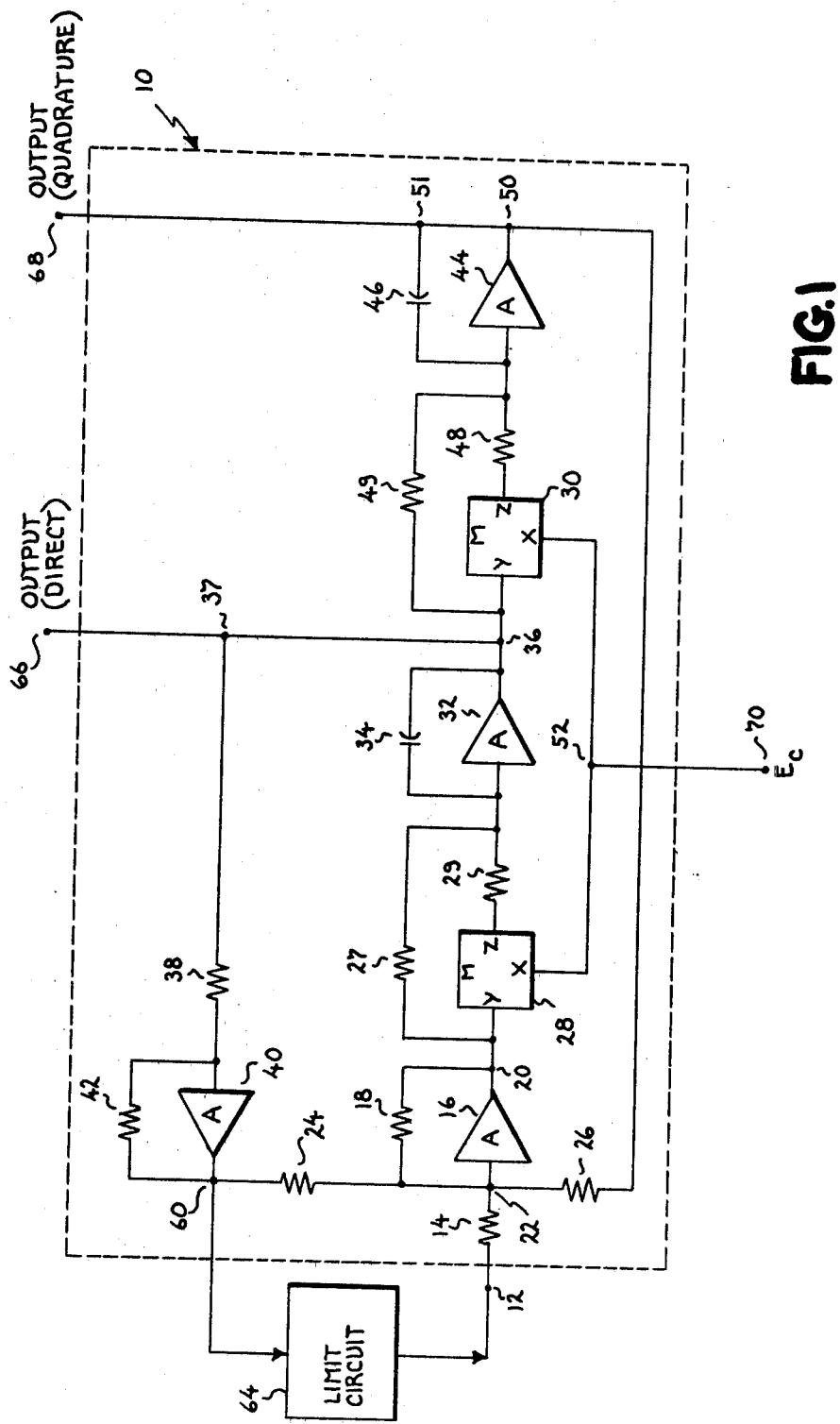
FIG. 1 is a schematic block diagram of the voltage controlled oscillator in accordance with the present invention.

Reference is now made to FIG. 1 which illustrates the voltage controlled oscillator (VCO) of the present invention in its preferred embodiment. Basically, the system includes a voltage tunable filter circuit, depicted within the dashed line block 10, and a feedback portion and an input control voltage which constitutes the remaining portion of FIG. 1. Those familiar with the aforementioned U.S. Pat. No. 3,978,420 will recognize that there is a substantial degree of similarity between that shown in the block 10 of the patent and block 10 of the present depiction. More specifically, the distinctions lie in a modification to the filter circuit 10 which comprises the addition of the resistors 27 and 49 which will be further explained hereinafter. Although similarities do exist, the operation of the circuitry here depicted and that shown in U.S. Pat. No. 3,978,420 are considerably different and provide essentially different end results. In addition, it should be noted that the depiction within block 10 is identical, at least in all material aspects to a further application of the modified self-tuning filter which is found in the aforementioned co-pending application Ser. No. 383,076.

In FIG. 1, the filter circuit 10 is provided with an input terminal 12 for receiving a feedback signal which is a function of the simulated resistance voltage as will be understood as this description proceeds. In the present description, it will be assumed for purposes of illustration that the center frequency of the feedback signal is 60 hertz (Hz). The signal at terminal 12 is applied by way of an input resistor 14 to a suitable summing amplifier 16. Amplifier 16 may be a conventional operational amplifier including a feedback resistor 18 tied between its output (junction 20) and its input (junction 22). (In all cases in this specification, operational amplifiers are shown having a single input. It is to be understood that, in accordance with common practice, this input is the inverting one and the non-inverting operational amplifier input will be connected to ground through a suitable resistor.) Two additional inputs by way of resistors 24 and 26 are also supplied to the amplifier. The signals thus applied correspond, respectively, as will be more fully understood as this description proceeds, to the voltages corresponding to the resistive and capacitive components of a simple resistance—inductance—capacitance (RLC) circuit which is simulated by the filter circuit 10. As is known, the voltage relationships existing in simple RLC circuits can be defined by the equation:

$$V_L = e - V_R - V_C \quad (1)$$

wherein;
 e = instantaneous applied voltage
 $V_L$ = inductance voltage
 $V_R$ = resistance voltage
 $V_C$ = capacitance voltage Thus, there appears at junction 20 the output of amplifier 16, a voltage which is proportional to the inductance voltage of the simulated circuit of the filter 10.

The signal at junction 20 is applied to two separate gain paths. The signal is first applied to a Y input of a multiplier 28 which also has an X input and an output Z. Multiplying circuits such as used at 28 are known in the art and provide at the Z output terminal a signal which is a function of the product of the two inputs to the X and Y terminals. Mathematically, the relationship existing in the multiplier circuit can be represented by the formula:

$$Z = X \cdot Y \cdot K_1$$

wherein;
 $K_1$ is a constant determined by the multiplier used. Multiplier circuits such as shown at 28 are commercially available and one suitable circuit for employment in the present invention is sold by Analog Devices, Inc., identified as a Model 432J. The signal applied to the X input of the multiplier 28 is the input control signal, $E_c$. This $E_c$ signal, from junction 52 may originate with any suitable source, not shown but represented by the terminal 70. As an example, the $E_c$ signal could originate from some form of manual control such as a potentiometer connected to a source of voltage. More likely, however, the $E_c$ signal would be derived from other circuitry with which that of the present invention is associated.

The output of multiplier 28 forms one input to an integrator circuit having a first input resistor 29 and an operational amplifier 32 having a capacitor 34 tied between its output and its input. A second signal is also integrated by the integrating circuit and it is seen that the signal at junction 20 is applied by a second integrator input resistor 27 to the operational amplifier 32. Thus, the output of operational amplifier 32, at junction 36, is the integral of the signals of the two gain paths from junction 20. That is, it is the integral of the signal at junction 20 which is being applied by the gain path including the multiplier 28 and resistor 29 and by the gain path including resistor 27. The output of the operational amplifier 32 at junction 36 is representative of the current which exists in the modified simulated RLC circuit and, as such, will also be proportional to the resistance voltage of that simulated circuit.

The signal at junction 36, because of the inverting nature of operational amplifiers, is of the incorrect polarity for application to amplifier 16 and is, therefore, applied by way of resistor 38 to an inverting amplifier 40 having resistor 42 tied between its output and its input. The output of amplifier 40 at junction 60 is applied by way of the previously mentioned resistor 24 to the input of amplifier 16 and thus forms the resistive voltage component earlier described.

In a manner similar to the employment of the signal at junction 20, the signal at junction 36 also is utilized through two gain paths. The first of these gain paths is through multiplier 30, which may be identical to multiplier 28, and the signal at junction 36 constitutes the Y input thereto. The signal applied to the X input of multiplier 30 is the same as that applied to the X input of multiplier 28, that is, the input control signal. The output of multiplier 30 is applied to a second integrator including a first input resistor 48 and an operational amplifier 44 having capacitor 46 tied between its input and its output. The signal at junction 36 is also applied by way of resistor 49 to the input of amplifier 44 such that the output of that amplifier (at junction 50) is the integral of the signal at junction 36 as modified by the two gain paths just described.

The signal at junction 50 represents the capacitance voltage of the simulated RLC circuit and this signal is delivered to the input junction 22 of amplifier 16 via resistor 26. Thus, it is seen that at the output of amplifier 16, the voltage is proportional to the simulated inductance voltage since its three inputs are proportional to the three components described and identified by the formula (1) above; i.e., the input voltage, the resistance voltage and the capacitance voltage by some factor determined by the various gains of the several paths.

Earlier mention was made of the feedback signal which forms one of the input signals to operational amplifier 16. In FIG. 1 it is seen that the signal representing the resistance voltage, a sine wave appearing at output 60 of amplifier 40, is applied as an input to signal limit circuit 64. The limit circuit 64 can be of any suitable type which provides a gain inversely related to the magnitude of the input signal. Preferably, however, circuit 64 takes the form of a sine wave to square wave converter and, in the preferred embodiment of the present invention, is comprised of an overdriven amplifier, such as will be described with respect to FIG. 2. It is apparent that other forms of converters such as properly coupled comparator circuits, clipper circuits, etc., could be used with equal facility. The output of converter 64 is applied to the input terminal 12 of amplifier 16 as earlier discussed.

Figure 2:
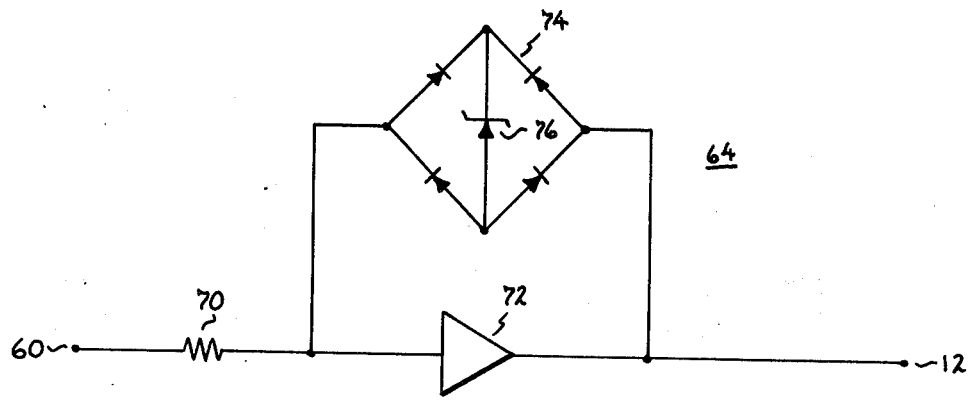
FIG. 2 is a schematic drawing illustrating in greater detail a portion of the circuit of FIG. 1 shown in block form and in accordance to the preferred embodiment of the present invention; and, FIG. 3 is a graphical representation of the relationship between the control voltage magnitude and the frequency of the output signal of the present invention as compared to that of the self-tuning filter of the prior art.

FIG. 2 illustrates the sine wave to square wave converter 64 in its preferred embodiment. As shown, the signal at junction 60 is applied via resistor 70 to an operational amplifier 72. A full wave diode bridge 74 having a zener diode 76 connected between its free junctions constitutes a feedback circuit between the output and input of the amplifier.

Having described the circuitry as shown in FIGS. 1 and 2, the explanation of its operation is substantially as follows. In the following explanation, the letter R with a subscript will denote the resistive value of a resistor. That is, $R_{27}$ denotes the resistive value of resistor 27. In a similar manner, a C with a subscript denotes the capacitance of a particular capacitor while the letter M with a subscript denotes the multiplication constant of a multiplier; for example, $M_{28}$ is the multiplication constant of the multiplier 28.

The special case use of the circuitry shown in FIG. 1 in accordance with the preferred embodiment of the present invention requires, for linearity, that certain relationships be established. These are, essentially:

$R_{27} = R_{49}$
$R_{29} = R_{48}$
$C_{34} = C_{46}$
$R_{26} = R_{18}$
$M_{28} = M_{30} = M$

It should be remembered that the center frequency of the pass band, that is the resonant frequency of the filter circuit within the dashed line block 10, is tunable by means of the signal $E_c$ at junction 52. From the foregoing, it can be determined that the output frequency, $$\omega_o = \frac{M}{R_{29} C_{34}} E_c + \frac{1}{R_{27} C_{34}}. \quad (2)$$

It is readily apparent that equation (2) represents a straight line characteristic or relationship between the input frequency and the input control signal $E_c$. The input frequency is, of course, the output of the circuit 64. Therefore, when the system is operating in a steady state, the output frequency of the oscillator is a function of the input control signal. Equation (2) makes it apparent that the circuit of FIG. 1, including the resistors 27 and 49 employed as the second gain path for the respective signals at junctions 20 and 36, when taken with the feedback path including circuit 64, constitutes a voltage controlled oscillator.

Insofar as usable outputs are concerned, the signal at junction 36 (also junction 37) representing the resistance voltage of the simulated circuit, is one possible source for an output signal. This output is shown as being available at terminal 66 and is designated as the in-phase or direct output. The signal at junction 50 (and thus at junction 51) is a second possible source of the output signal for the oscillator of the present invention. This output is illustrated as being available at terminal 68 and is designated the quadrature output since it will be displaced by ninety electrical degrees from the output available at terminal 66. Either or both of the outputs at terminals 66 and 68 may be used. These signals will be sine waves of a frequency centered around the base frequency.

Figure 3:
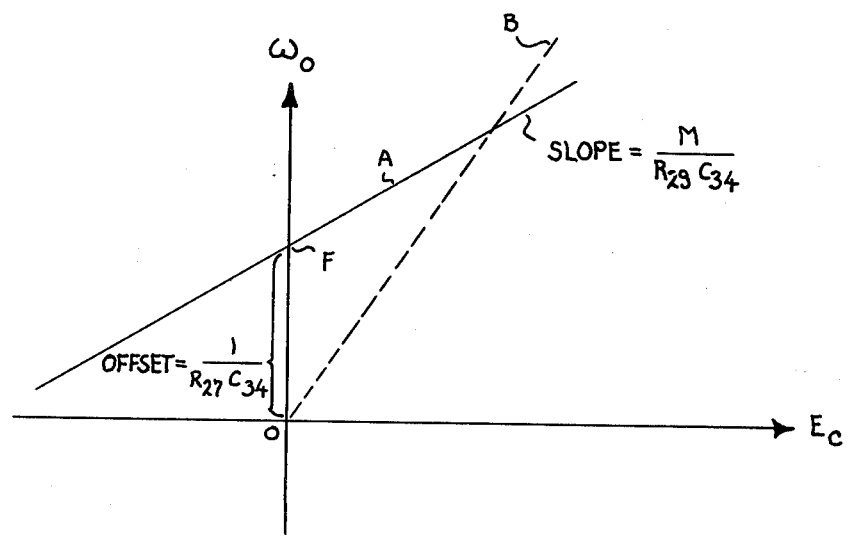

Equation (2) taken with the graphical representation of FIG. 3 demonstrates the characteristics of the VCO of the present invention. In equation (2), the constant of the first term, that is, $M/R_{29} C_{34}$, denotes the slope of the linear relationship between the output frequency and the input control signal while the term $1/R_{27} C_{34}$ is the frequency offset. In FIG. 3, which plots the output frequency $\omega_o$ versus the input control signal $E_c$, this is graphically illustrated by line A, the offset being depicted by the distance on the $\omega_o$ axis between 0 and point F. Typically, if working in a 60 Hz system and in accordance with the example earlier begun in this description, this offset would be 60 Hz. Thus, in accordance with this invention, the center frequency about which it is desired to operate is chosen through selecting the values of resistor 27 and capacitor 34. The rate at which it is desired to change the frequency of the output signal in response to a change in the control signal $E_c$ (the slope of line A) is determined by the selection of the values of $R_{29}$, $C_{34}$ and M.

Line B in FIG. 3 is included for comparison purposes and shows the type of relationship which would be available in a system such as is taught by the Burr-Brown reference earlier cited or by a system such as shown by FIG. 1 but excluding the gain paths comprised of resistors 27 and 49. It is seen that line B is broader band without a frequeny offset and lacks the control capabilities of the system of the present invention.

Thus, it is seen that it has been provided a VCO which is voltage tunable and which provides relatively small frequency excursions for relatively large changes in an input control signal. In addition, other outputs such as those at junctions 20, 36 and 50 can be used as indications of the various simulated RLC circuit voltages in accordance with the teachings of aforementioned U.S. Pat. No. 3,978,420.

While there has been shown and described what is at present considered to be the preferred embodiment of the invention, modifications thereto will readily occur to those skilled in the art. For example, the quantity relationships set forth between the various resistors, capacitors and multiplication constants are, in the preferred embodiment of the invention, desirable from the standpoint of providing a linear relationship between the input control signal and the frequency of the output signal. While this is a very desirable feature, it is recognized that it is not an absolute necessity and that some variation in these values is permissible if other than a linear relationship is acceptable, or in fact desired for some reason. It is also noted that, while in the preferred embodiment the outputs of the two gain paths are in each case added and the sum integrated, an equal result could be achieved by other methods such as integrating in each path and then summing the two integrated values. It is not desired, therefore, that the invention be limited to the specific arrangement shown and described and it is intended to cover in the appended claims all such modifications as fall within the true spirit and scope of the invention.

What is claimed is:

1. A voltage controlled oscillator for producing a variable frequency output signal in response to the magnitude of an input control signal comprising:
   (a) a tunable filter circuit for simulating a resistance—inductance—capacitance circuit having a resonant frequency which is adjustable in response to said input control signal, said filter circuit comprising,
      (1) circuit means for providing at its output a first signal representative of the voltage of the inductance of the simulated circuit in response to a feedback signal, a signal representing the capacitance voltage and a signal representing the resistance voltage,
      (2) a first gain path including first multiplying means responsive to said first signal and said input control signal to provide a signal proportional to the product thereof,
      (3) a second gain path for providing an output signal proportional to said first signal,
      (4) first integrating means responsive to the output signals of said first and second gain paths to develop said variable frequency output signal proportional in magnitude to the resistance voltage of the simulated circuit and in frequency to the extant value of said input control signal, (5) third gain path means including second multiplying means responsive to said signal proportional to the resistance voltage and said input control signal to provide an output signal, (6) fourth gain path means for providing an output signal proportional to said signal proportional to the resistance voltage, (7) second integrating means responsive to the output signals of said third and fourth gain paths to develop a signal proportional to the capacitance voltage of said simulated circuit; and, (b) feedback means including a signal limit circuit responsive to the signal representing the resistance voltage for providing said feedback signal.

2. The invention in accordance with claim 1 wherein said signal limit circuit comprises a sine wave to square wave converter.

3. The invention in accordance with claim 2 wherein said sine wave to square wave converter comprises an overdriven amplifier.

4. The invention in accordance with either claim 1 or claim 2 or claim 3 wherein said first and third gain paths have substantially equal gain constants and said second and fourth gain paths have substantially equal gain constants.

5. The invention in accordance with claim 1, claim 2 or claim 3 wherein each of said second and fourth gain paths comprises resistance means.

6. The invention in accordance with claim 4 wherein each of said second and fourth gain paths comprises resistance means.

* * * * *